(12) United States Patent
Yoshioka et al.

(10) Patent No.: US 7,855,720 B2
(45) Date of Patent: Dec. 21, 2010

(54) DIGITAL-TO-ANALOG CONVERTER AND IMAGE DISPLAY DEVICE

(75) Inventors: Masaki Yoshioka, Kanagawa (JP); Genichiro Oga, Kanagawa (JP); Ken Kitamura, Kanagawa (JP); Takaaki Sugiyama, Kanagawa (JP); Motoyasu Yano, Kanagawa (JP)

(73) Assignee: Sony Corporation, Tokyo (JP)

( * ) Notice: Subject to any disclaimer, the term of this patent is extended or adjusted under 35 U.S.C. 154(b) by 818 days.

(21) Appl. No.: 11/878,334

(22) Filed: Jul. 24, 2007

(65) Prior Publication Data

US 2008/0024478 A1    Jan. 31, 2008

(30) Foreign Application Priority Data

Jul. 26, 2006    (JP)    ............... 2006-203553

(51) Int. Cl.
*G09G 5/00*    (2006.01)
(52) U.S. Cl. .................. 345/210; 345/98; 341/144
(58) Field of Classification Search .............. 345/87, 345/204–210, 690, 691–693; 341/144–154
See application file for complete search history.

(56) References Cited

U.S. PATENT DOCUMENTS

| | | | | | |
|---|---|---|---|---|---|
| 6,191,720 | B1* | 2/2001 | Zhang | ................ | 341/145 |
| 7,453,386 | B2* | 11/2008 | Jeon et al. | ................ | 341/145 |
| 7,573,411 | B2* | 8/2009 | Shin et al. | ................ | 341/145 |
| 2008/0024478 | A1* | 1/2008 | Yoshioka et al. | ........... | 345/210 |
| 2008/0030489 | A1* | 2/2008 | Kim et al. | ................ | 345/205 |
| 2008/0084409 | A1* | 4/2008 | Rao | ................ | 345/209 |
| 2008/0150779 | A1* | 6/2008 | Sung | ................ | 341/145 |

FOREIGN PATENT DOCUMENTS

JP    2002-175021    6/2002

* cited by examiner

*Primary Examiner*—Amare Mengistu
*Assistant Examiner*—Dmitriy Bolotin
(74) *Attorney, Agent, or Firm*—Rader, Fishman & Grauer PLLC

(57) ABSTRACT

Disclosed herein is a digital-to-analog converter. The digital-to-analog converter includes: a higher resistor string; a lower resistor string; an operational amplifier; a higher selector; a lower selector; a first switch; a higher capacitor; a second switch; a third switch; and a control circuit.

11 Claims, 8 Drawing Sheets

DIGITAL-TO-ANALOG CONVERTER AND IMAGE DISPLAY DEVICE

CROSS-REFERENCES TO RELATED APPLICATIONS

The present invention contains subject matter related to Japanese Patent Application JP 2006-203553 filed in the Japanese Patent Office on Jul. 26, 2006, the entire contents of which being incorporated herein by reference.

BACKGROUND OF THE INVENTION

1. Field of the Invention

The present invention relates to a digital-to-analog converter, and an image display device which includes a function of the digital-to-analog converter in each of driving units for driving respective signal lines of a pixel portion. Here, the digital-to-analog converter includes resistor strings for higher-order bits and lower-order bits of an input digital (video) signal, and samples and holds higher voltage values generated in the higher resistor string, and adds lower voltage values generated in the lower resistor string to the higher voltage value.

2. Description of the Related Art

A horizontal driver for driving respective signal lines corresponding to pixel columns, respectively, is provided in the form of a driving IC in a display panel, for example, a liquid crystal display device.

Although a digital video signal is inputted to the horizontal driver, it is necessary to convert the digital video signal into an analog pixel driving signal. For this reason, a digital-to-analog converter (hereinafter referred to "a DAC" or "a D/A converter") having a performance corresponding to the number of bits of the video signal (for example, eight bits or more) is built every signal line in the horizontal driver.

Although the various systems have been proposed for the DAC, especially, in an application of an image display device or the like, the DAC needs to be provided so as to correspond to several hundreds to several thousands of video signal lines. Thus, from a request for reduction of an arrangement space, it is necessary to successfully balance a high performance (highly precise conversion) and a small space.

In order to realize the highly precise conversion, a circuit needs to be structured as simply as possible. A resistor string type DAC (D/A converter) is known as a D/A converter using a system meeting this request. This resistor string type D/A converter, for example, is described in Japanese Patent Laid-Open No. 2002-175021.

FIG. 1 shows a basic circuit structure of the resistor string type D/A converter.

A resistor string RS including a series connection body composing of $2^N$ resistor elements RE0, RE1, ..., RE($2^N$-2) and RE($2^N$-1) is connected between an input terminal Tb and an input terminal Tt. Here, a minimum voltage (analog lower limit) Vb of an analog voltage to be outputted is inputted to the input terminal Tb. Also, a maximum value (analog upper limit) Vt of the analog voltage is inputted to the input terminal Tt.

Switches (hereinafter referred to as "select switches") are connected to nodes between adjacent resistor elements in the series connection body, and a connection node (a connection node on the input terminal Tb side in this example) between an end resistor element and the input terminal Tb or the input terminal Tt, respectively. In the example shown in FIG. 1, a higher select switch S0 is connected to a connection node between the resistor elements RE0 and RE1. Likewise, a select switch S1 is connected to a connection node between the resistor elements RE1 and RE2. Thus, this connection relationship is repeated even for other select switches S3 to S($2^N$-1) while the resistor elements are shifted one by one.

A side opposite to the resistor elements for $2^N$ select switches S0 to S($2^N$-1) is short-circuited and is connected to an output terminal To.

When one select switch is selected in accordance with a digital signal, having N bits, inputted thereto in the D/A converter, a desired analog D.C. voltage which is obtained by equally dividing (Vt-Vb) by $2^N$ is outputted in the form of an output voltage Vo to the output terminal To.

SUMMARY OF THE INVENTION

When the number of bits is N, the number of necessary analog switches (select switches) becomes $2^N$ in the D/A converter using this resistor string system. Thus, the D/A converter using this system is disadvantageous in that in the case of the conversion for multiple bits, the number of select switches becomes enormous.

Especially, when the D/A converter using this system is used in the driving for signal lines of an image display device, it is difficult to dispose these select switches because of a large number of select switches. Also, an increase in cost of a driving IC is caused.

In the light of the above-mentioned circumstances, it is therefore desirable to provide a digital-to-analog converter which is capable of reducing the number of select switches by using a simple structure while a high conversion precision is maintained, and an image display device which uses the digital-to-analog converter in the driving of signal lines.

According to an embodiment of the present invention, there is provided a digital-to-analog converter, including: a higher resistor string; a lower resistor string; an operational amplifier; a higher selector; a lower selector; a first switch; a higher capacitor; a second switch; a third switch; and a control circuit. The higher resistor string is configured to generate a plurality of higher voltage values corresponding to higher-order bits of an input digital signal, respectively. The lower resistor string is configured to generate a plurality of lower voltage values corresponding to lower-order bits of the input digital signal, respectively. The higher selector is configured to select one higher voltage value corresponding to the higher-order bits from among the plurality of higher voltage values generated in the higher resistor string, and output the one higher voltage value thus selected to one input of the operational amplifier. The lower selector is configured to select one lower voltage value corresponding to the lower-order bits from among the plurality of lower voltage values generated in the lower resistor string, and output the one lower voltage value thus selected to the other input of the operational amplifier. The first switch is connected to an output of the higher selector. The higher capacitor is connected between the first switch and the one input of the operational amplifier. The second switch is connected between one electrode of the higher capacitor and an output of the operational amplifier. The third switch is connected between the other electrode of the higher capacitor and the output of the operational amplifier. The control circuit is configured to control the first, second and third switches.

Preferably, a lower capacitor is connected between the lower selector and the other input of the operational amplifier; and a fourth switch which is turned on when an initial D.C. voltage is set in the other input of the operational amplifier is connected to a connection node between the lower capacitor and the operational amplifier.

Preferably, capacitance values of the higher capacitor and the lower capacitor are set so that capacitance values when viewed from the connection nodes between the corresponding capacitors and the operational amplifier become equal to each other.

According to another embodiment of the present invention, there is provided an image display device, including: a pixel portion; a plurality of signal lines; a plurality of driving units; a higher resistor string; a lower resistor string; and a control circuit. The pixel portion has a large number of voltage driven pixels arranged in matrix. The plurality of signal lines are provided so as to correspond to columns of the pixel columns in the pixel portion. The plurality of driving units are provided so as to correspond to the plurality of signal lines, respectively. The higher resistor string provided in each of the plurality of driving units is configured to generate a plurality of higher voltage values corresponding to higher-order bits of an input digital video signal, respectively. The lower resistor string provided in each of the plurality of driving units is configured to generate a plurality of lower voltage values corresponding to lower-order bits of the input digital video signal, respectively. The control circuit is configured to control the first, second and third switches. Each of the plurality of driving units, including an operational amplifier, a higher selector, a lower selector, a first switch, a higher capacitor, a second switch, and a third switch. The higher selector is configured to select one higher voltage value corresponding to the higher-order bits from among the plurality of higher voltage values generated in the higher resistor string, and output the one higher voltage value thus selected to one input of the operational amplifier. The lower selector is configured to select one lower voltage value corresponding to the lower-order bits from among the plurality of lower voltage values generated in the lower resistor string, and output the one lower voltage value thus selected to the other input of the operational amplifier. The first switch is connected to an output of the higher selector. The higher capacitor is connected between the first switch and the one input of the operational amplifier. The second switch is connected between one electrode of the higher capacitor and an output of the operational amplifier. The third switch is connected between the other electrode of the higher capacitor and the output of the operational amplifier.

Preferably, in each of the plurality of driving units, a lower capacitor is connected between the lower selector and the other input of the operational amplifier; and a fourth switch which is turned on when an initial D.C. voltage is set in the other input of the operational amplifier is connected to a connection node between the lower capacitor and the operational amplifier.

Preferably, capacitance values of the higher capacitor and the lower capacitor are set so that capacitance values when viewed from the connection nodes between the corresponding capacitors and the operational amplifier become equal to each other.

According to the embodiments of the present invention, the higher-order bits (the number of bits is arbitrarily set as long as it is smaller than the number of bits of the input digital signal) of the input digital signal are inputted to the higher selector. On the other hand, the remaining lower-order bits are inputted to the lower selector.

The higher selector selects any one of a plurality of higher voltage values generated at the connection nodes between the adjacent resistor elements in the resistor string, and outputs the higher voltage value thus selected to one input of the operational amplifier. Here, in the end of the resistor string, the connection node is one to which a maximum voltage or a minimum voltage for the resistor element is applied. The first switch and the higher capacitor are connected from the output side of the higher selector in this order in series between the output of the higher selector and one input of the operational amplifier. In addition, one electrode (for example, the electrode on the operational amplifier side) of the higher capacitor, and the output of the operational amplifier can be short-circuited through the second switch. Moreover, the other electrode (for example, the electrode on the higher selector side) of the higher capacitor, and the output of the operational amplifier can be short-circuited through the third switch.

The output of the lower selector is connected so as to be inputable to the other input of the operational amplifier.

The control circuit controls timings at which the first to third switches are turned on, respectively. As a result, the output which is obtained by adding precisely the lower voltage values corresponding to the lower-order bits, respectively, to the higher voltage values corresponding to the higher-order bits, respectively, is obtained from the operational amplifier.

According to the embodiments of the present invention, an effect is offered such that the number of select switches can be reduced with the simple circuit structure while the high conversion precision is maintained.

DETAILED DESCRIPTION OF THE PREFERRED EMBODIMENTS

Hereinafter, preferred embodiments of the present invention will be described in detail by giving an image display device incorporating therein a digital-to-analog converter every signal line driving unit as an example with reference to the accompanying drawings.

First Embodiment

Figure 2:
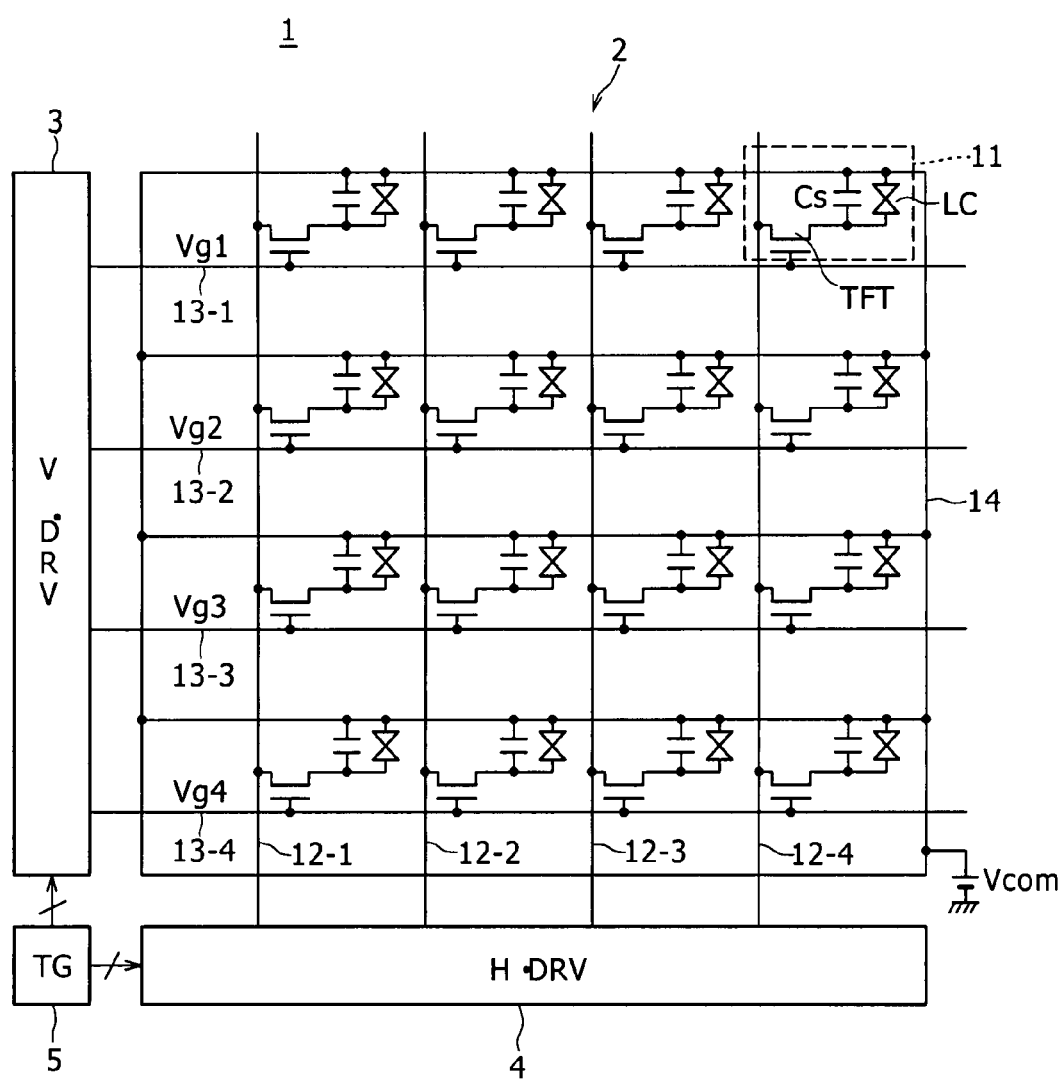
FIG. 2 is a circuit block diagram of a liquid crystal display panel of an image display device according to a first embodiment of the present invention.

FIG. 2 is a circuit diagram showing a circuit structure of a liquid crystal display panel of an image display device according to a first embodiment of the present invention. Also, FIG. 2 shows a pixel arrangement for 4 (rows)×4 (columns) as an example for the sake of simplicity.

In a liquid crystal display panel 1 shown in FIG. 2, each of pixels 11 for 4 (rows)×4 (columns) arranged in matrix includes a thin film transistor TFT, a liquid crystal cell LC, and a holding capacitor Cs. Here, a pixel electrode of the liquid crystal cell LC is connected to one of a source and a drain of the thin film transistor TFT. Also, one electrode of the holding capacitor Cs is connected to the one of the source and the drain of the thin film transistor TFT. Signal lines (data lines) 12-1 to 12-4 are wired along a column direction of a pixel arrangement so as to correspond to columns of the pixels 11, respectively. Also, gate lines 13-1 to 13-4 are wired along a row direction of the pixel arrangement so as to correspond to rows of the pixels 11, respectively.

In the pixels 11, the sources (or drains) of the thin film transistors TFTs are connected to the data lines 12-1 to 12-4, respectively. Gates of the thin film transistors TFTs are connected to the gate lines 13-1 to 13-4, respectively. Also, in all the pixels 11, counter electrodes of the liquid crystal cells LCs, and the other electrodes of the holding capacitors Css are commonly connected to a Cs line 14. A predetermined D.C. voltage is supplied as a common voltage Vcom to the Cs line 14.

The pixels 11 are arranged in matrix in such a manner. Also, a pixel portion 2 is structured in the manner as has been described above. That is to say, the data lines 12-1 to 12-4 are wired so as to correspond to the columns of the pixels 11, respectively. Also, the gate lines 13-1 to 13-4 are wired so as to correspond to the rows of the pixels 11, respectively. In the pixel portion 2, one ends of the gate lines 13-1 to 13-4 are connected to output ends of the rows of a vertical driver (V.DRV) 3, respectively.

The vertical driver 3 scans the gate lines 13-1 to 13-4 in a vertical direction (in the column direction) every display period of time for one picture, thereby successively selecting the pixels connected to the gate lines 13-1 to 13-4, respectively, in rows. That is to say, when the vertical driver 3 supplies a vertical scanning pulse to the gate line 13-1, the pixels of the columns belonging to the first row are all selected. When the vertical driver 3 supplies the vertical scanning pulse to the gate line 13-2, the pixels of the columns belonging to the second row are all selected. Similarly to the above, the vertical scanning pulse is supplied to the gate lines 13-3 and 13-4 in order.

A horizontal driver (H.DRV) 4 is disposed on one side of the pixel portion 2 in the column direction. In addition, a timing generator (TG) 5 for supplying various clock signals and control signals to the vertical driver 3 and the horizontal driver 4 is provided.

The horizontal driver 4 is a semiconductor multi-channel display driver, and has driving units which are provided so as to correspond to the data lines 12-1 to 12-4, respectively.

Figure 3:
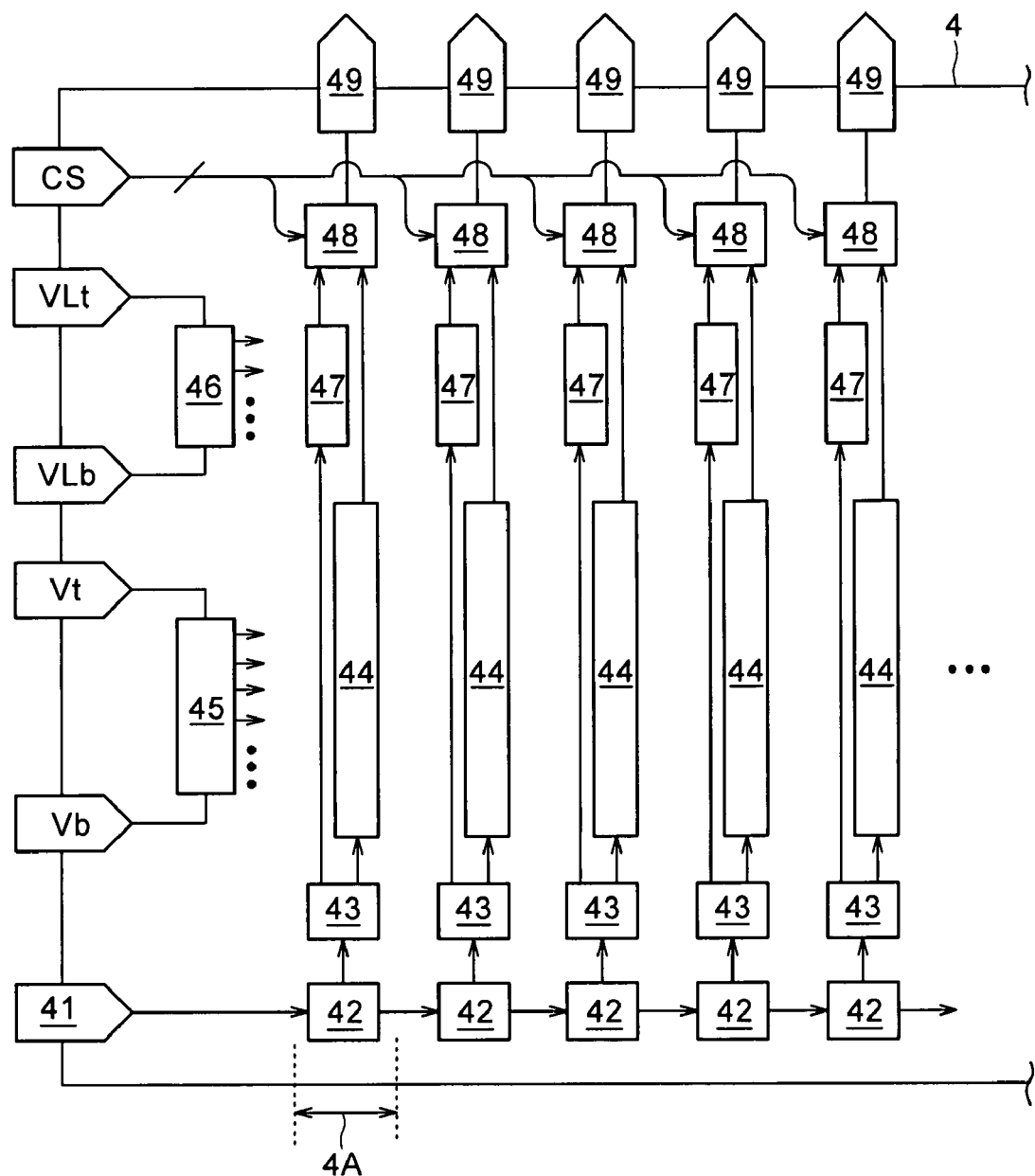
FIG. 3 is a block diagram of a horizontal driver of the liquid crystal display panel of the image display device according to the first embodiment of the present invention.

FIG. 3 shows a block diagram of the horizontal driver 4 of the pixel portion 2 shown in FIG. 2.

The horizontal driver 4 has driving units 4A (up to five driving units are shown in FIG. 3) which are provided so as to correspond to the data lines, respectively. A data input terminal 41 is one to which digital data is inputted in the form of a digital (video) signal. The data input terminal 41 is provided commonly to all the driving units 4A. Data output terminals 49 are provided so as to correspond to the driving units 4A, respectively.

Each of the driving units 4A includes a shift register 42, a latch 43, a higher selector 44, a lower selector 47, and a sample and hold amplifier 48 as a sample and hold adder which are provided in order from the data output side.

Of them, the sample and hold amplifier 48 receives as its inputs control signals CS1, CS2, CS3, and CS4 supplied from the timing generator 5 shown in FIG. 2 through a CS input terminal. In addition, while not especially illustrated in the figure, the clock signal is inputted from the timing generator 5 to each of the shift register 42 and the latch 43. Each of the control signals CS1, CS2, CS3 and CS4 is synchronized with the clock signal. For this reason, all the driving units 4A operate synchronously with one another.

Digital data having (N+M) bits is inputted to the horizontal driver 4 through the data input terminal 41. The digital data is constituted by the higher-order N bits and the lower-order M bits. The digital data is firstly inputted to the shift registers 42 of the driving unit 4A located at an end, and is then transferred to the shift register 42 one after another in a disposition direction of the driving units 4A (channels).

In the case where a point-sequential driving system is adopted, the transferred data is outputted successively (one after another at given time intervals) to the latches 43 within the respective channels to be temporarily held therein, and is sent to stages in and after a next stage in order. On the other hand, in the case where a line-sequential driving system is adopted, the data for one display line is concurrently outputted to all the latches 43 at a time point when the holding of the data in all the shift registers 42 is complete, and the data is then concurrently sent to the stages in and after the next stage.

The output of the latch 43 is classified into two systems. That is to say, the higher-order N bits held in the latch 43 are outputted to the higher selector 44, while the lower-order M bits held in the latch 43 are outputted to the lower selector 47.

Figure 1:
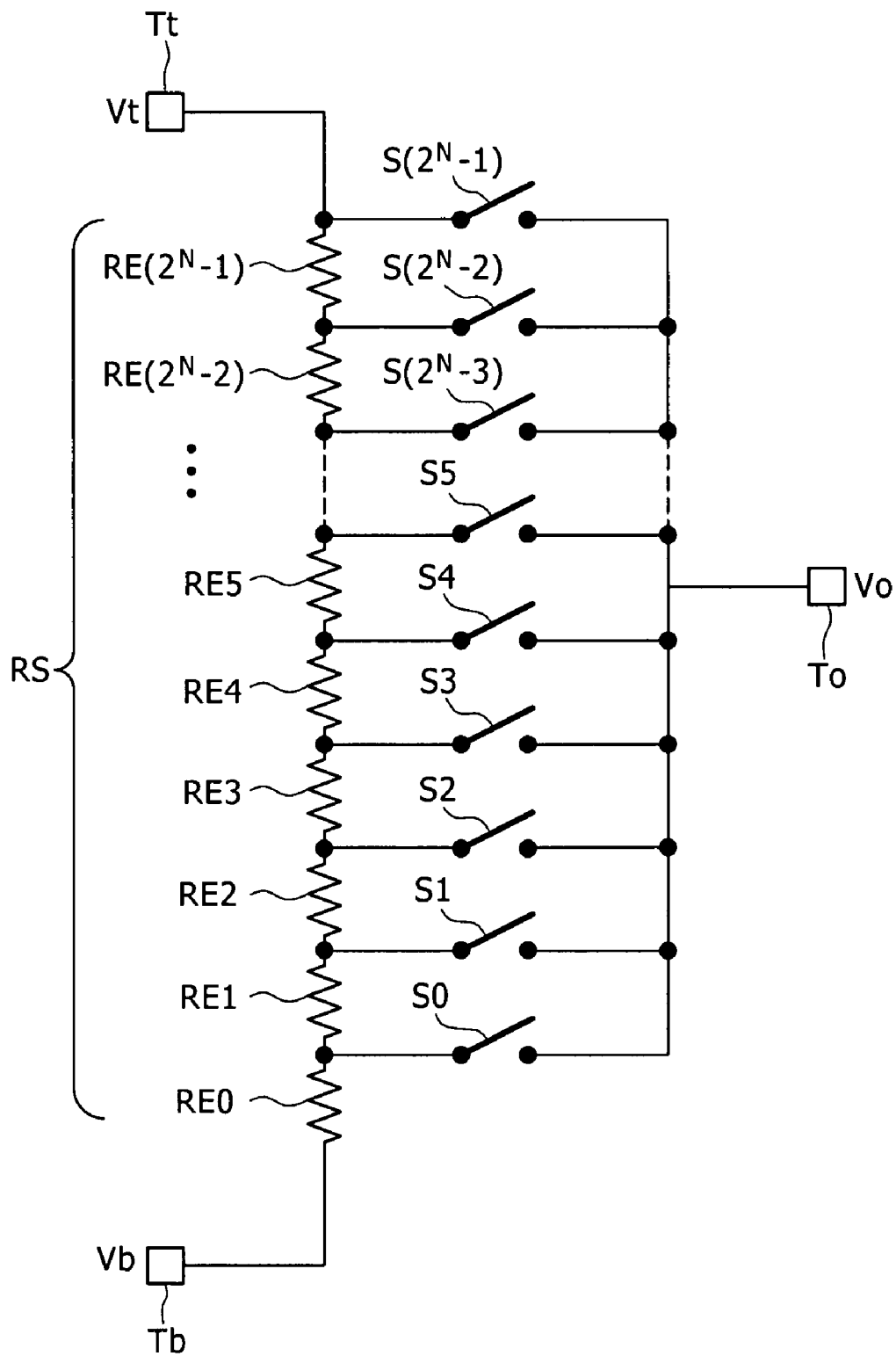
FIG. 1 is a circuit diagram of a basic circuit structure of a resistor string type D/A converter of the related art.

The higher selector 44 has $2^N$ select switches similarly to the case of the select switches S0 to S($2^N$−1) shown in FIG. 1. However, the number of select switches is small all the more because the number, N, of bits corresponding to the higher selector 44 in this embodiment is the number of higher-order bits and thus is smaller than the total number, N, of bits in the related art shown in FIG. 1. Any one of the $2^N$ select switches is selected and is turned on, so that the higher selector 44 operates.

Likewise, the lower selector 47 has $2^M$ select switches. Any one of the $2^M$ select switches is selected and is turned on, so that the lower selector 47 operates.

Note that, an illustration of a circuit structure for selecting the select switch from among the $2^N$ select switches of the higher selector 44, and an illustration of a circuit structure for selecting the select switch from among the $2^M$ select switches of the lower selector 47 are omitted in FIG. 3 for the sake of simplicity. Each of these circuit structures is structured in the form of a decoder for repeatedly decoding the input digital data in N bits and M bits.

The horizontal driver 4 shown in FIG. 3 includes one higher resistor string 45 and one lower resistor string 46. Here, the one higher resistor string 45 is common to all the higher selectors 44. The one lower resistor string 46 is common to all the lower selectors 47.

The higher resistor string 45 is a series connection body of $2^N$ higher resistor elements (corresponding to the resistor elements RE0 to RE($2^N$−1) shown in FIG. 1) similarly to the resistor string RS of the related art shown in FIG. 1. Here, $2^N$ is a number corresponding to the number, N, of higher-order bits. In addition, the lower resistor string 46 is a series connection body of $2^M$ lower resistor elements. Here, $2^M$ is a number corresponding to the number, M, of lower-order bits.

An analog upper limit voltage Vt is applied to one end of the higher resistor string 45 through a Vt input terminal. An analog lower limit voltage Vb is applied to the other end of the higher resistor string 45 through a Vb input terminal. In a phase of application of the analog upper limit voltage Vt and the analog lower limit voltage Vb, when each of the resistance values of the resistor elements is equal to "R", a higher voltage value is generated at each of connection nodes between the adjacent resistor elements in the higher resistor string 45. Here, the higher voltage value is obtained by equally dividing (Vt−Vb) by the number of resistor elements. The higher voltage value generated across each of the resistor elements is supplied to each of all the higher selectors 44. In addition, in the case where the same connection relationship as that in the related art shown in FIG. 1 is obtained, the analog upper limit Vt is also supplied to each of the higher selectors 44.

Note that, unlike the related art shown in FIG. 1, a circuit structure may also be adopted such that the analog lower limit Vb is supplied to each of all the higher selectors 44. In addition, a circuit structure may also be adopted such that the number of resistor elements is reduced by one, and both the analog upper limit Vt and the analog lower limit Vb are supplied to each of all the higher selectors 44.

The same voltage applied to each of the resistor elements of the higher selectors 44 as that in the related art shown in FIG. 1 is expressed in the form of (Vt−Vb)/$2^N$ or (Vt−Vb)/($2^N$+1). Hereinafter, this voltage is referred to as "a section voltage".

A section top voltage VLt is applied to one end of the lower resistor string 46 through a VLt input terminal. A section bottom voltage VLb is applied to the other end of the lower resistor string 46 through a VLb input terminal. A difference between the section top voltage VLt and the section bottom voltage VLb is set to a voltage equal to "the section voltage" defined above. The reason for this is because a change step of the output voltage which roughly changes in the higher-order bits with "the section voltage" as a unit is finely divided into $2^M$ parts in the lower-order bits.

The two outputs of the higher selector 44 and the lower selector 47 are inputted to the sample and hold amplifier 48. The two selector outputs thus inputted are added to each other in the sample and hold amplifier 48, and the resulting output is outputted as a D/A converter output having (N+M) bits to an output terminal 49, thereby driving corresponding one of the signal lines of the liquid crystal display panel 1.

At this time, the sample and hold operation, and the addition output operation of the sample and hold amplifier 48 are controlled in accordance with a control signal inputted to the sample and hold amplifier 48 through the CS input terminal.

Figure 4:
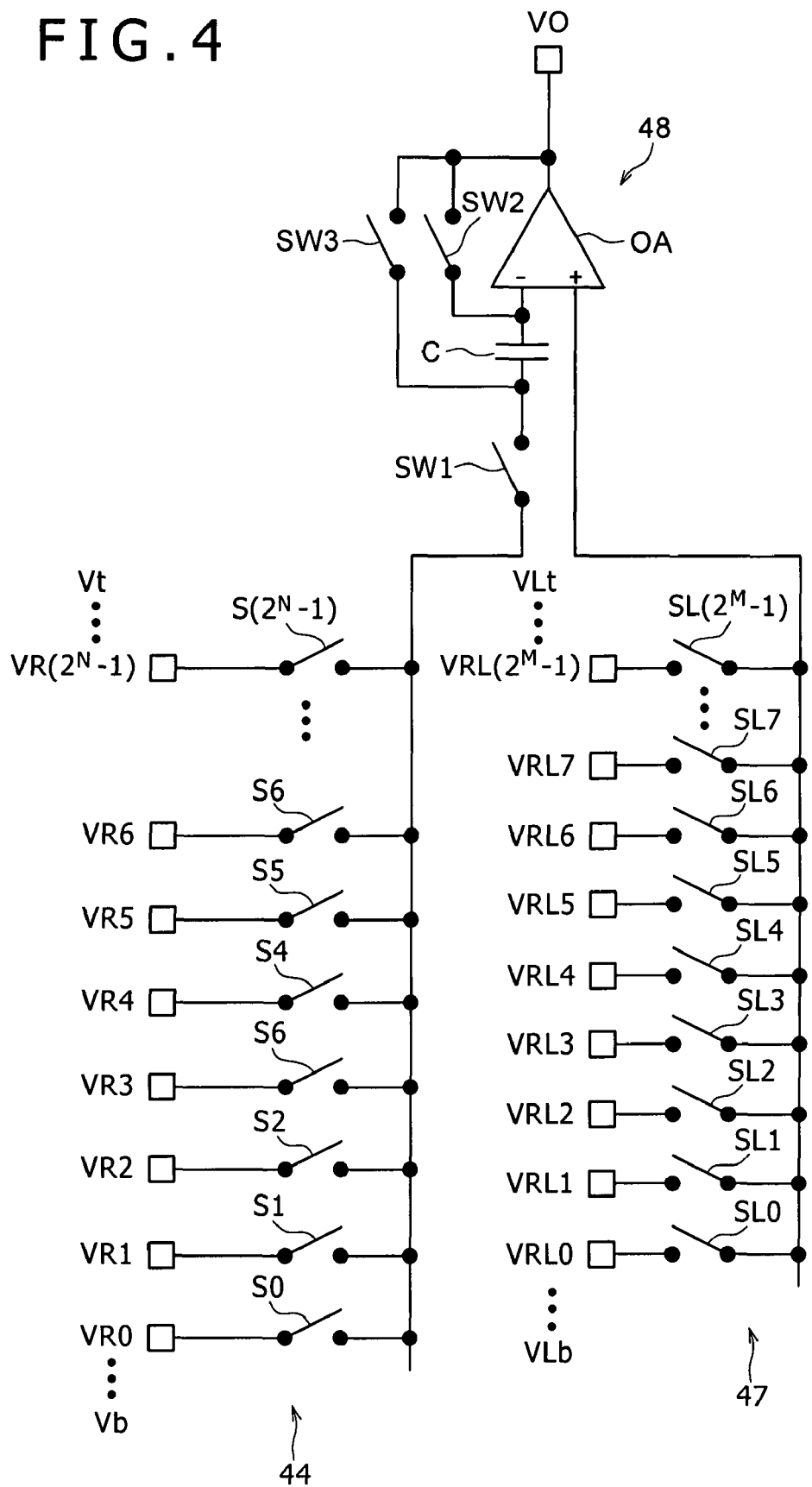
FIG. 4 is a circuit diagram minutely showing a part of a driving unit of the horizontal driver of the liquid crystal display panel of the image display device according to the first embodiment of the present invention.

FIG. 4 shows minutely a part of the driving unit 4A including the higher selector 44, the lower selector 47, and the sample and hold amplifier 48 shown in FIG. 3.

The sample and hold amplifier 48 includes an operational amplifier OA, a higher capacitor C, a first switch SW1, a second switch SW2, and a third switch SW3.

The first switch SW1 and the higher capacitor C are connected in this order from the output side of the higher selector 44 in series between the output of the higher selector 44 and an inverting input terminal "−" of the operational amplifier OA. In addition, the second switch SW2 is connected between one electrode of the higher capacitor C and the output of the operational amplifier OA. Here, one electrode of the higher capacitor C is an electrode on a side of an inverting input "−" of the operational amplifier OA in this embodiment. Moreover, the third switch SW3 is connected between the other electrode (an electrode on the higher selector 44 side in this embodiment) of the higher capacitor C, and the output of the operational amplifier OA. Here, the operations for turning on the three switches having the first switch SW1 to the third switch SW3 are controlled at suitable timings in accordance with the control signals inputted through the CS input terminal shown in FIG. 3, respectively.

The higher selector 44 has $2^N$ higher select switches S0 to S($2^N$−1). Output nodes of the $2^N$ higher select switches S0 to S($2^N$−1) are commonly connected to one another, and are also connected to an input node of the first switch SW1.

Higher voltage values VR0 to VR($2^N$−1) which are generated in the higher resistor string 45 shown in FIG. 3 can be supplied to input nodes of the $2^N$ higher select switches S0 to S($2^N$−1), respectively. A voltage difference between the adjacent higher voltage values in the higher voltage values VR0 to VR($2^N$−1) is the given selection voltage described above. The higher voltage values VR0 to VR($2^N$−1) are voltages which are generated at connection nodes between the adjacent higher resistor elements in the higher selector 44, or at application node, respectively. Here, the analog upper limit Vt or the analog lower limit Vb is applied to the application node.

The $2^N$ higher select switches S0 to S($2^N$−1) are controlled (for example, by a decoder (not shown) so that only one of them is turned on in accordance with the higher-order bits of the digital signal inputted to the D/A converter concerned.

The lower selector 47 has $2^M$ lower select switches SL0 to SL($2^M$−1). Output nodes of the $2^M$ lower select switches SL0 to SL($2^M$−1) are commonly connected to one another, and are also connected to a non-inverting input "+" of the operational amplifier OA.

Lower voltage values VRL0 to VRL($2^M$−1) which are generated in the lower resistor string 46 shown in FIG. 3 can be supplied to input nodes of the $2^M$ lower select switches SL0 to SL ($2^M$−1), respectively. Each of the lower voltage values VRL0 to VRL($2^M$−1) is a voltage which is obtained by equally dividing a voltage equivalent to the above-mentioned given section voltage by $2^M$ or ($2^M$+1). The lower voltage values VRL0 to VRL($2^M$−1) are voltages which are generated at connection nodes between the adjacent lower resistor elements in the lower selector 47, respectively, or a section top voltage VLt or a section bottom voltage VLb.

The $2^M$ lower select switches SL0 to SL($2^M$−1) are controlled (for example, by a decoder (not shown)) so that only one of them is turned on in accordance with the lower M bits of the digital signal inputted to the D/A converter concerned.

Next, an operation of the driving unit 4A shown in FIG. 4 will now be described in detail with reference to timing charts of FIGS. 5A to 5G.

Here, each of the first switch SW1, the second switch SW2 and the third switch SW3 is turned on in accordance with the digital control signal at an "H" level, and is turned off in accordance with the digital control signal at an "L" level.

Figure 5:
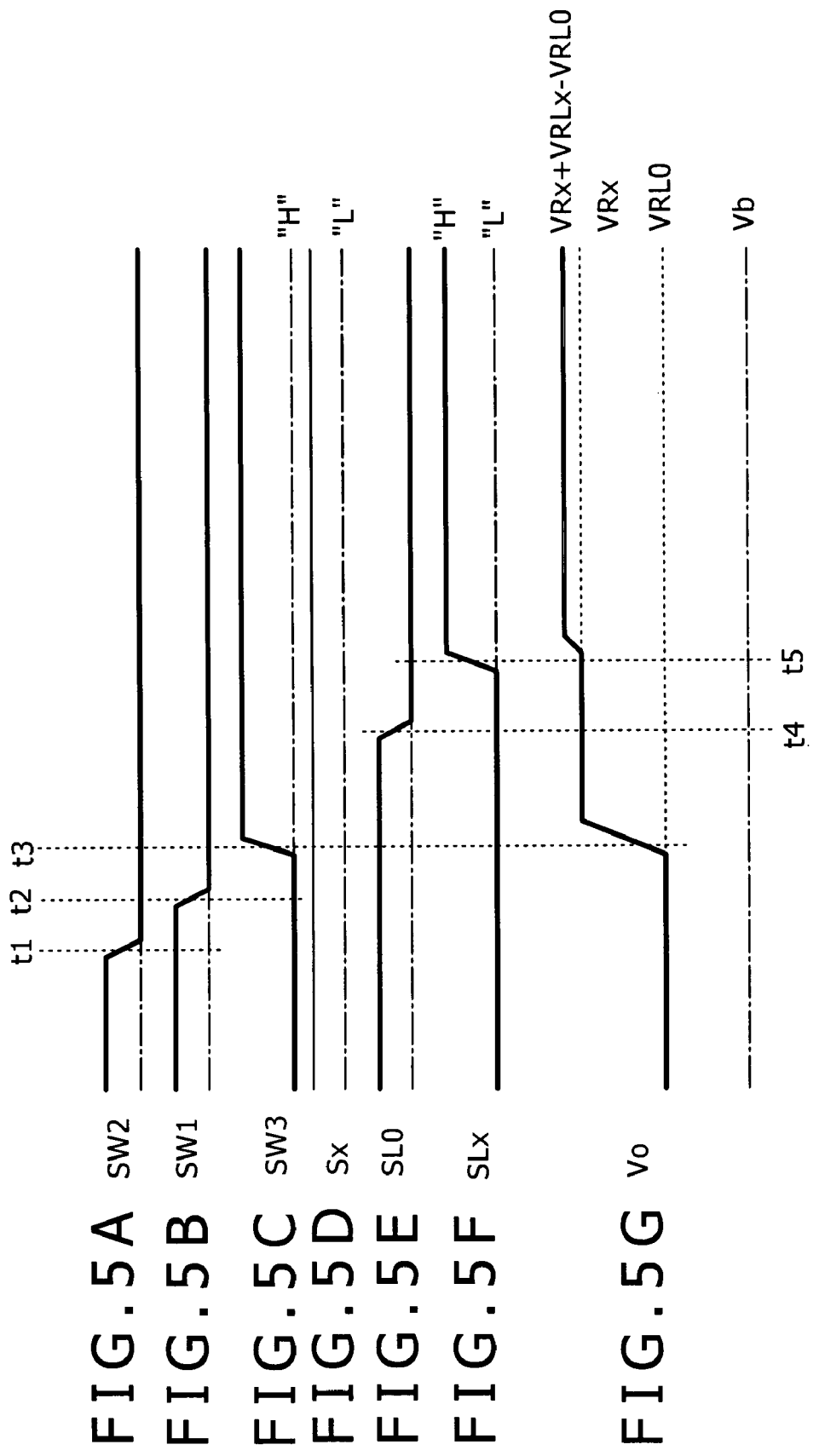
FIGS. 5A to 5G are timing charts explaining an operation of the driving unit shown in FIG. 4.

As shown in FIGS. 5A to 5C, in an initial state, each of the first switch SW1 and the second switch SW2 is held in an on state, while the third switch SW3 is held in an off state. In addition, as shown in FIG. 5D, of the higher select switches S0 to S($2^N$−1), one higher select switch Sx corresponding to the higher-order bits of the input digital signal is held in the on state. Moreover, in the initial state, as shown in FIG. 5E, of the $2^M$ lower select switches SL0 to SL($2^M$−1), only the lower select switch SL0 having the lower voltage value of VRL0 closest to the section bottom voltage VLb is held in the on state.

In this initial state, referring now to FIG. 4, since the first switch SW1 is held in the on state, the higher voltage value VRx is inputted to the higher selector side electrode of the higher capacitor C through the higher select switch Sx held in the on state. In addition, since the second switch SW2 is held in the on state, the inverting input "−" and the output of the operational amplifier OA are connected to each other. In addition, the lower voltage value VRL0 is inputted from the lower selector 47 to the non-inverting input "+" of the operational amplifier OA. Therefore, an output voltage Vo of the operational amplifier OA becomes a voltage which is equal to the lowest lower voltage value VRL0.

Next, as shown in FIG. 5A, the second switch SW2 is turned off at a time t1. As a result, the output of the operational amplifier OA is disconnected from the higher selector 44. However, at this time, the higher voltage value VRx is applied across both the electrodes of the higher capacitor C with the lowest lower voltage value VRL0 as a reference.

Next, as shown in FIG. 5B, the first switch SW1 is turned off at a time t2, thereby disconnecting the higher capacitor C from the higher selector 44. As a result, the higher voltage value VRx is held in the higher capacitor C with the lowest lower voltage value VRL0 as the reference.

Next, as shown in FIG. 5C, the third switch SW3 is turned on at a time point t3. As a result, the output voltage of the operational amplifier OA is fed back to the operational amplifier OA through the third switch SW3 and the higher capacitor C. As shown in FIG. 5G, this leads to that the output voltage Vo of the operational amplifier OA becomes a voltage equal to the higher voltage value VRx. The higher voltage value VRx selected by the higher selector 44 is outputted from the operational amplifier OA through the operation until this time.

As shown in FIG. 5E, the lower select switch SL0 of the lower selector 47 is turned off at a time t4. Subsequently, as shown in FIG. 5F, of the $2^M$ lower select switches SL0 to SL($2^M-1$), the lower select switch SLx corresponding to the lower-order M bits of the digital signal inputted to the D/A converter concerned is turned on at a time t5. As a result, the voltage at the non-inverting input "+" of the operational amplifier OA changes from the lowest lower voltage value VRL0 obtained through the initialization to the lower voltage value VRLx corresponding to the lower select switch SLx.

When the voltage at the non-inverting input "+" of the operational amplifier OA changes in a state in which the output voltage the operational amplifier OA is fed back to the operational amplifier OA in such a manner, the output voltage Vo also changes by the same voltage as that by which the voltage at the non-inverting input "+" of the operational amplifier OA changes. Therefore, when the voltage at the non-inverting input "+" of the operational amplifier OA changes from the lowest lower voltage value VRL0 to the lower voltage value VRLx, as shown in FIG. 5G, the output voltage Vo of the operational amplifier OA changes from the higher voltage value VRx to a voltage (VRx+VRLx−VRL0) higher than the higher voltage value VRx. A voltage (VRLx−VRL0) added to the higher voltage value VRx is a voltage difference between the lowest lower voltage value VRL0 and the lower voltage value VRLx. Here, the lower voltage value VRLx is selected by the lower selector 47 in accordance with the lower-order M bits of the input digital signal. Therefore, when the number of higher-order bits of the input digital signal is N, and the number of lower-order bits thereof is M, the voltage (VRx+VRLx−VRL0) which is outputted from the operational amplifier OA at and after the time t5 becomes an analog signal which is obtained by subjecting the input digital signal having (N+M) bits to the D/A conversion.

The corresponding one of the signal lines in the liquid crystal display panel 1 is driven in accordance with this output signal from the D/A converter. More specifically, the analog voltage corresponding to the bit value of the input digital signal is outputted from the horizontal driver 4 shown in FIG. 2. Also, that analog voltage is applied across the pixel electrodes of the liquid crystal cell LC through the thin film transistor TFT which is held in the on state based on the scanning made by the vertical driver 3. An electric field generated in the liquid crystal cell LC at this time is determined in accordance with the value of the analog voltage supplied over the corresponding one of the signal lines. Therefore, the brightness of the pixel changes with the gradation corresponding to the input digital signal.

Second Embodiment

In a second embodiment of the present invention, the structure on the non-inverting input "+" side of the sample and hold amplifier 48 is improved for the purpose of realizing the higher precision D/A conversion.

In the first embodiment having the circuit structure shown in FIG. 4, the output of the lower selector 47 is directly inputted to the non-inverting input "+" of the operational amplifier OA. In this case, there is room for improvements in the following respects.

The higher capacitor C is connected to the inverting input "−" of the operational amplifier shown in FIG. 4. However, a parasitic capacitance more or less exists in the connection node between the higher capacitor C and the inverting input "−" of the operational amplifier OA. This parasitic capacitance contains a coupling capacitance between a conductive layer and another conductive layer in a semiconductor device, a junction capacitance of a semiconductor impurity region of the thin film transistor TFT, and the like.

The following disadvantage is caused when it is difficult to disregard this parasitic capacitance as compared with the capacitance value of the higher capacitor C. That is to say, the above-mentioned voltage difference attenuates by an amount corresponding to a ratio of the parasitic capacitance to the capacitance of the higher capacitor C in accordance with an electric charge distribution between both the capacitances. As a result, the output voltage (VRx+VRLx−VRL0) becomes slightly larger than a design value thereof.

The second embodiment of the present invention has a circuit structure for realizing the more highly precise digital-to-analog (D/A) conversion by improving this respect found in the first embodiment.

Figure 6:
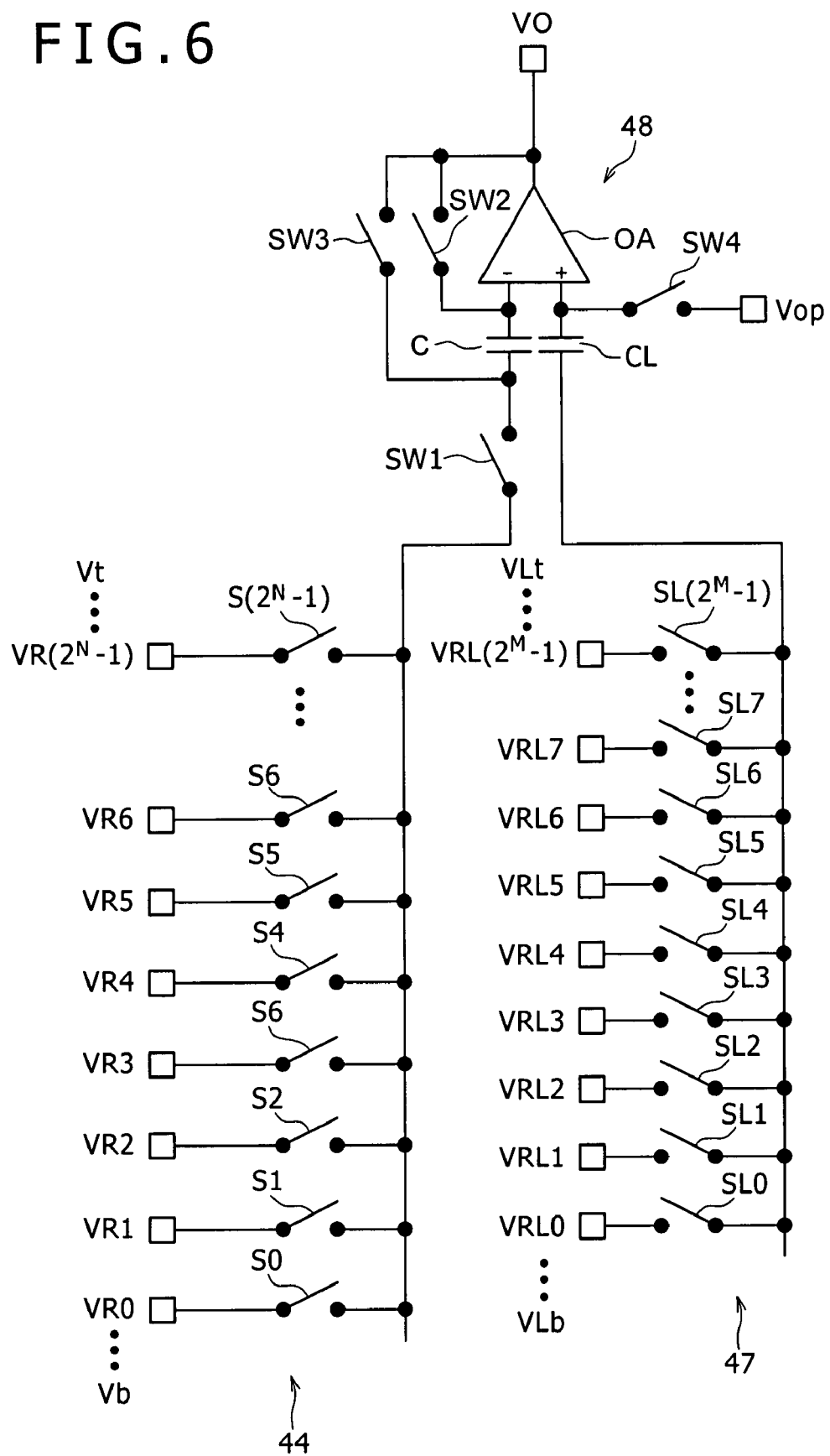
FIG. 6 is a circuit diagram minutely showing a part of a driving unit of a horizontal driver of a liquid crystal display panel of an image display device according to a second embodiment of the present invention.

FIG. 6 is a circuit diagram showing minutely a part of a driving unit of a horizontal drive in a digital-to-analog converter incorporated in an image display device according to the second embodiment of the present invention.

In the second embodiment, a portion connected to the non-inverting input "+" of the operational amplifier is changed from the first embodiment shown in FIG. 4. That is to say, a lower capacitor CL is inserted between the non-inverting input "+" of the operational amplifier OA, and the lower selector 47. In addition, a fourth switch SW4 is added through which the operational amplifier OA and a D.C. voltage Vop are connected to each other. The fourth switch SW4 is connected between a connection node between the non-inverting input "+" of the operational amplifier OA and the lower capacitor CL, and a feeding terminal for the D.C. voltage Vop. Also, the fourth switch SW4 is controlled in accordance with the control signal inputted through the CS input terminal shown in FIG. 3 similarly to the first, second and third switches SW1, SW2 and SW3.

Here, it is desirable that a capacitance value when viewed from the above-mentioned connection node having the fourth switch SW4 connected thereto, and a capacitance value when viewed from the connection node, on the inverting input "−" side of the operational amplifier OA, having the second switch SW2 connected thereto are made uniform. That is to say, the two capacitance values are desirably made equal to each other or are equalized to each other to the extent that no influence is exerted on the conversion precision. For the simplest method of realizing this, it is recommended that the capacitance values of the lower capacitor CL and the higher capacitor C are approximately equalized to each other. Furthermore, the fourth switch SW4 and the second switch SW2 are approximately equalized in size to each other.

Note that, the D.C. voltage Vop can be arbitrarily set within an operating range of the operational amplifier OA.

Next, an operation of the driving unit of the D/A converter incorporated in the image display device will now be described in detail with reference to timing charts shown in FIGS. 7A to 7H.

Here, each of the first switch SW1, the second switch SW2, the third switch SW3 and the fourth switch SW4 is turned on in accordance with the digital control signal at the "H" level, and is turned off in accordance with the digital control signal at the "L" level.

Hereinafter, differences between the first embodiment and the second embodiment will be mainly described, and the operation of the driving unit of the second embodiment common to that of the driving unit of the first embodiment will be simplified.

As shown in FIGS. 7A to 7D, in an initial state, each of the first switch SW1 and the second switch SW2 is held in an on state, and the third switch SW3 is held in an off state. Also, the fourth switch SW4 which is newly provided in this embodiment is held in the on state.

Figure 7:
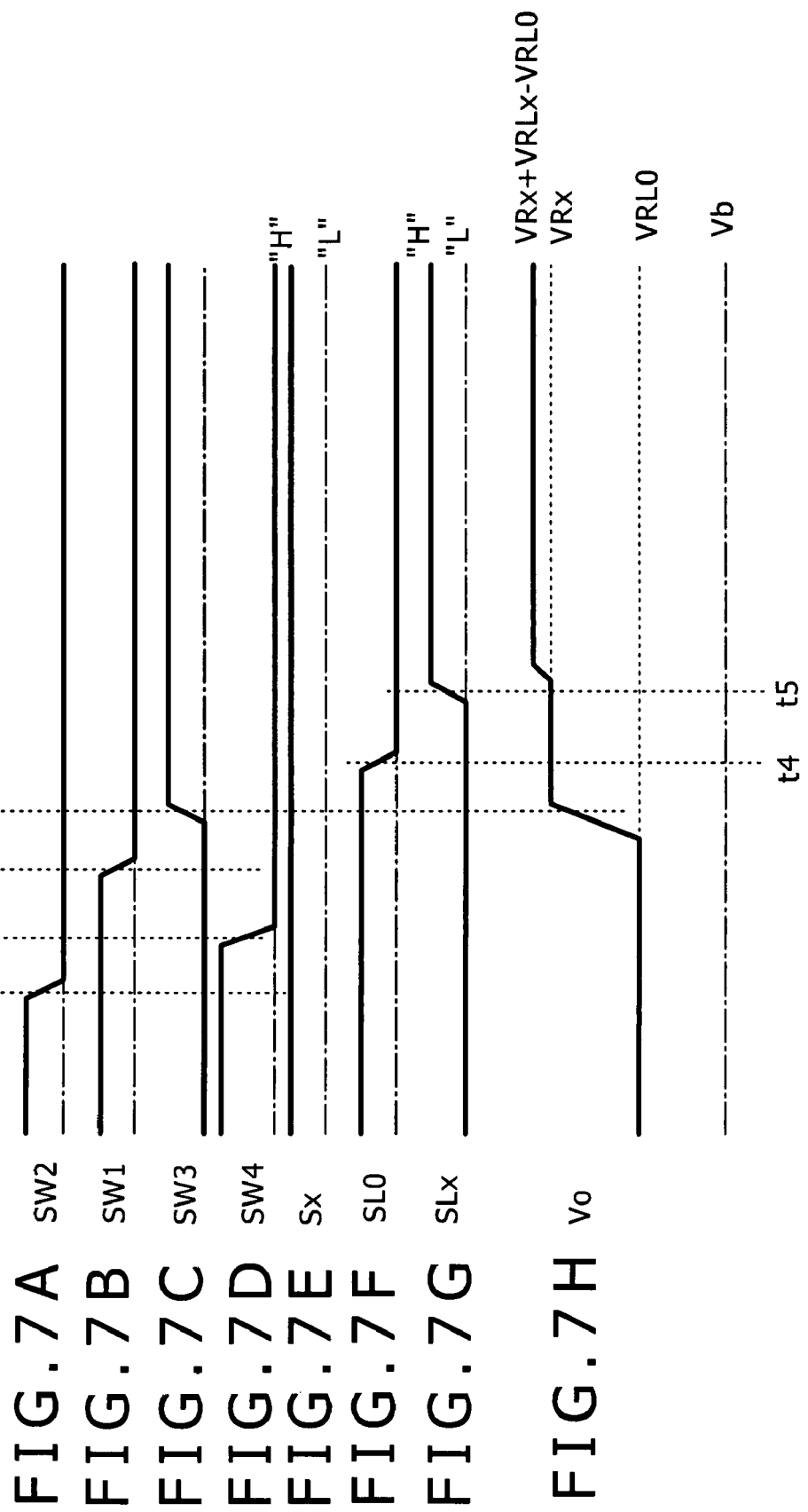
FIGS. 7A to 7H are timing charts explaining an operation of the driving unit shown in FIG. 6.

In the initial state, similarly to the first embodiment, one higher select switch Sx corresponding to the higher-order bits is held in the on state (refer to FIG. 7E). Also, the lower select switch SL0 having the lower voltage value VRL0 closest to the section bottom voltage VLb is held in the on state (refer to FIG. 7F).

In this state, similarly to the first embodiment, the higher voltage value VRx is inputted to the higher selector side electrode of the higher capacitor C, and thus the inverting input "−" and the output of the operational amplifier OA are connected to each other. On the other hand, the output voltage Vo becomes a voltage equal to the D.C. voltage Vop because the D.C. voltage Vop is connected to the non-inverting input "+" of the operational amplifier OA.

Next, the second switch SW2 is turned off at a time t1 (refer to FIG. 7A). At this time, the higher voltage value VRx is applied across both the electrodes of the higher capacitor C with the D.C. voltage Vop as a reference.

Subsequently, the fourth switch SW4 is turned off at a time t12 (refer to FIG. 7D). Here, the potential at the non-inverting input "+" of the operational amplifier OA is held at the D.C. voltage Vop and thus does not change because the D.C. voltage Vop is held by the higher capacitor CL. Therefore, there is no change in the output voltage Vo of the operational amplifier OA (refer to FIG. 7H).

Next, the first switch SW1 is turned off at a time t2 (refer to FIG. 7B), thereby disconnecting the higher capacitor C from the higher selector 44. As a result, the higher voltage value VRx is held by the higher capacitor C with the D.C. voltage Vop as the reference.

Next, the third switch SW3 is turned on at a time t3 (refer to FIG. 7C) to feed the output voltage of the operational amplifier OA back to the operational amplifier OA, thereby equalizing the output voltage Vo of the operational amplifier OA to the higher voltage value VRx (refer to FIG. 7H).

After that, the lower select switch SL0 of the lower selector 47 is turned off at a time t4 (refer to FIG. 7F). Also, the lower select switch SLx of the lower selector 47 corresponding to the lower-order M bits is turned on (refer to FIG. 7G). As a result, the same output voltage (VRx+VRLx−VRL0) as that shown in FIG. 5G is obtained from the operational amplifier OA because a voltage change (VRLx−VRL0) is applied to the non-inverting input "+" of the operational amplifier OA through the lower capacitor CL.

Third Embodiment

A third embodiment of the present invention relates to a resistor string, and thus can be repeatedly applied to each of the first and second embodiments of the present invention described above.

Figure 8:
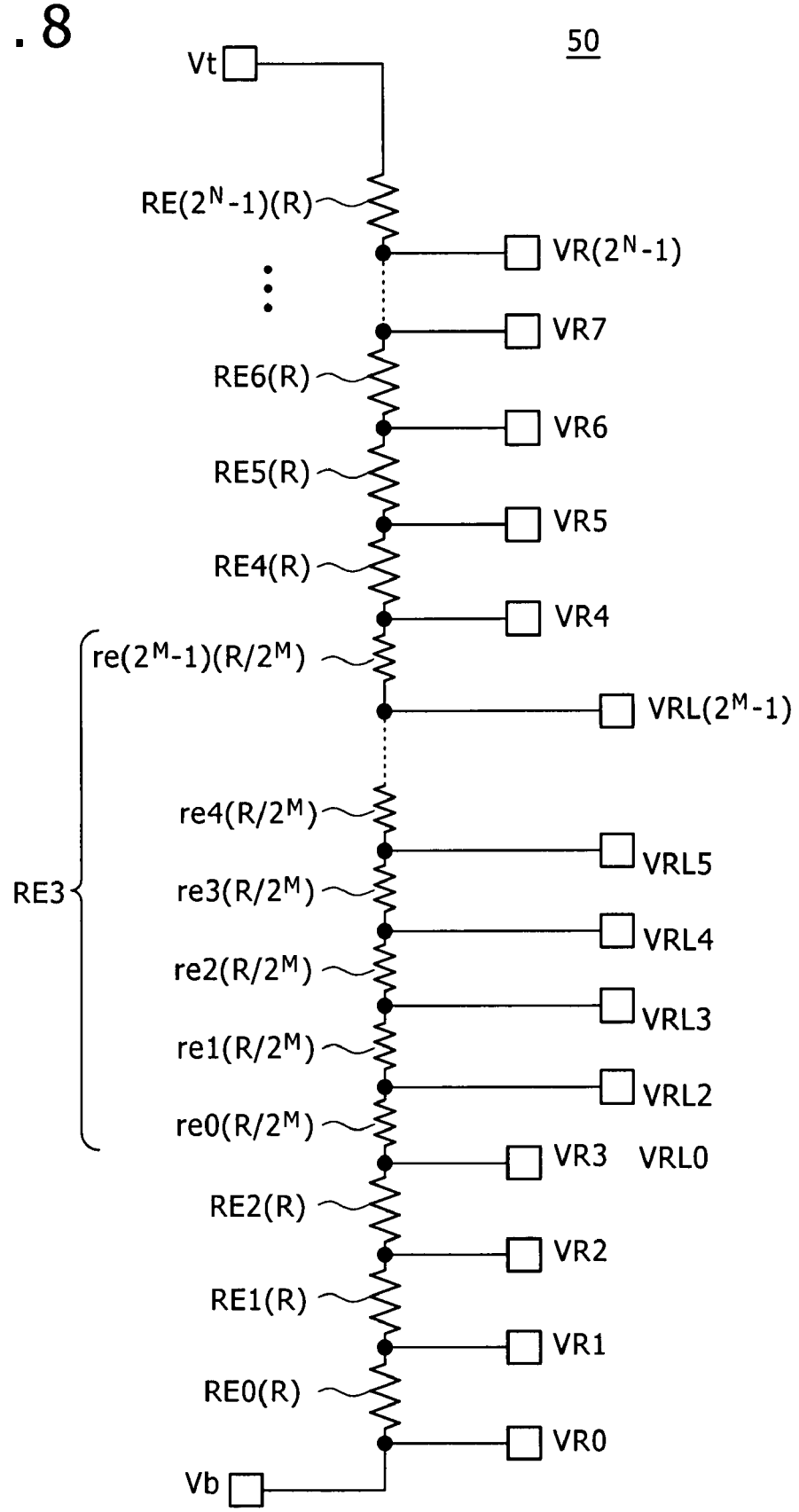
FIG. 8 is a circuit diagram showing a resistor string of a resistor string type D/A converter of an image display device according to a third embodiment of the present invention.

FIG. 8 shows a resistor string of a digital-to-analog converter incorporated in the image display device according to the third embodiment of the present invention.

In the block diagram of the horizontal driver 4 shown in FIG. 3, the higher resistor string 45 and the lower resistor string 46 are provided separately from each other. However, in the resistor string 50 shown in FIG. 8, the higher resistor string 45 and the lower resistor string 46 are integrated with each other so as to form a series connection body. Here, comparing the resistor string 50 of FIG. 8 with the resistor string 45 in the related art of FIG. 1, the output nodes of the higher voltage values VR0 to VR($2^N$−1) are shifted one resistor element to the analog lower limit Vb side. This change is also possible in the first embodiment as well of the present invention.

The resistor string 50 shown in FIG. 8 is one commonly used for the higher-order N bits and the lower-order M bits. The analog upper limit Vt is applied to one end of the resistor string 50, and the analog lower limit Vb is applied to the other end thereof.

The resistor string 50 includes $2^N$ resistor elements RE0 to RE($2^N$−1) having the same resistance value R. However, in this embodiment, one of the $2^N$ resistor elements RE0 to RE($2^N$−1), for example, the resistor element RE3 in this case includes a series connection body having $2^M$ resistor elements re0 to re($2^M$−1) each having a smaller resistance value than the resistance value R. The $2^M$ resistor elements re0 to re($2^M$−1) are provided for expression of the lower-order M bits and each of them has a resistance value $R/2^M$.

In the case of the example shown in FIG. 8, the whole of the $2^M$ resistor elements re0 to re($2^M$−1) has the same function as that of one resistor element RE3. Thus, the insertion of the $2^M$ resistor elements re0 to re($2^M$−1) each having the same small resistance value $R/2^M$ exerts no influence on the setting of the higher voltage value VRx corresponding to the higher-order N bits.

On the other hand, a potential difference between the higher voltage value VR3 and the smallest lower voltage value VRL0 is constant. Thus, with the circuit structure of the driving unit 4A shown in FIG. 4 or FIG. 6, only the voltage difference (VRLx−VRL0) is added to the output of the operational amplifier OA. Therefore, the potential difference between the higher voltage value VR3 and the smallest lower voltage value VRL0 exerts no influence on the circuit operation as long as it is constant. This means that the resistor element, having the resistance value R, which can be replaced with the $2^M$ resistor elements re0 to re($2^M$−1) may be any one of the $2^N$ resistor elements RE0 to RE($2^N$−1).

However, when the series resistor body has a slight dispersion in the resistance value R, the closer the position in the series resistor body gets to the center of the $2^N$ resistor elements RE0 to RE($2^N$−1), the larger this influence becomes. Therefore, the better, the closer the resistor element, having the resistance value R, which can be replaced with the $2^M$ resistor elements re0 to re($2^M-1$) gets to the analog upper limit Vt side or to the analog lower limit Vb side.

Fourth Embodiment

In a fourth embodiment of the present invention, the lower selector switches SL0 to SL($2^M-1$), for example, shown in FIG. 4 or FIG. 6 are replaced with low withstand voltage switches, respectively.

In general, a voltage of about more than ten volts (V) is necessary for the horizontal driver 4 for driving the liquid crystal display panel 1 shown in FIG. 2. This voltage is higher than that necessary for the general logic IC. Therefore, high withstand voltage transistors (high withstand voltage FETs) should be made separately from the transistors for logic, and the high withstand voltage TFTs should be used in the D/A converter.

However, when the high withstand voltage TFTs are impartially used as the transistors provided in the D/A converter, an area penalty becomes large, and thus it becomes difficult to perform a design for the arrangement of the high withstand voltage TFTs within the horizontal driver 4.

A range of an analog voltage treated by the lower selector 47 is equal to "the section voltage". In other words, the range of the voltage treated by the lower selector 47 has a small value which is $\frac{1}{2}^N$ of the voltage range (Vt−Vb) treated by the higher selector 44. In this embodiment, attention is focused on this respect. That is to say, the withstand voltage of each of the selector switches of the lower selector 47 is reduced as compared with that of each of the selector switches of the higher selector 44 without a hindrance in terms of the operation. As a result, the individual switch sizes are reduced. The $2^M$ lower selector switches exist every channel (every driving unit 4A). Thus, even when an effect of reduction in size of one switch is small, the large area reduction, and the enhancement of the degree of freedom of the arrangement of the lower selection switches can be obtained as a whole.

The first to fourth embodiments of the present invention which have been described so far have the various advantages which will be described below.

In the first to fourth embodiments of the present invention, the select switch group is classified into the part for the higher-order bits and the part for the lower-order bits. Consequently, it becomes possible to greatly reduce the number of select switches of the resistor string type D/A converter.

That is to say, $2^N$ switches are necessary for the N-bit resistor string type D/A converter. However, according to the first to fourth embodiments of the present invention, $2^J+2^K$ switches (where J+K=N) has only to be necessarily provided. For example, when N=8, and J=K=4, 32 switches have to be provided although 256 switches are necessarily provided in the past.

Since the number of switches can be reduced in the manner as described above, it becomes possible to suppress an increase in area even in the multi-bit type D/A converter.

In addition, the suppression of the increase in area results in that it is possible to suppress an increase in the parasitic capacitance parasitized on each of the wiring nodes. As a result, it becomes possible to suppress a degradation of a conversion speed, or to increase the resistance values in the resistor string. Thus, it is possible to further reduce the power consumption.

Moreover, even when having a relatively simple circuit structure, the sample and hold amplifier 48 can perform the precise voltage addition.

According to the second embodiment of the present invention, when the voltage at the non-inverting output "+" of the operational amplifier OA is changed to change the output voltage of the operational amplifier OA, it becomes possible to suppress that an error occurs in the output voltage by the capacitance ratio of the parasitic capacitance of the node associated with the inverting output "−" of the operational amplifier OA to the higher capacitor C. As a result, it is possible to realize the highly precise D/A converter having the less error occurring therein.

In addition, with the circuit structure of the driving circuit 4A shown in FIG. 4, an error occurs due to a switching noise caused when the second switch SW2 is turned off. However, with the circuit structure of the driving circuit 4A shown in FIG. 6, the error occurring due to the switching noise caused when the second switch SW2 is turned off can be cancelled with an error component occurring when the fourth switch SW4 is turned off. As a result, it is possible to realize the highly precise D/A converter having the less error occurring therein.

Moreover, the non-inverting input "+" of the operational amplifier OA is capacitive-coupled to the lower selector 47. Thus, the values of the lower voltage values VRL0 to VRL ($2^M-1$) can be set independently of one another with the D.C. voltage Vop as the reference. As a result, optimization of the D.C. voltage Vop results in that it becomes possible to perform the control in accordance with which the more highly precise output is obtained.

According to the third embodiment of the present invention, the supply of each of the section top voltage VLt and the section bottom voltage VLb becomes unnecessary. As a result, it is possible to remove the VLt terminal and the VLb terminal of the horizontal driver 4 shown in FIG. 3.

In addition, an increase in area can be suppressed because the lower resistor string 46 needs not to be specially provided.

The suppression of the increase in area results in that it is possible to suppress an increase in the parasitic capacitance parasitized on each of the wiring nodes. As a result, it becomes possible to suppress a degradation of a conversion speed, or to increase the resistance values in the resistor string. Thus, it is possible to further reduce the power consumption. In addition, a current caused to flow through each of the resistor elements is suppressed and the consumption current is further reduced all the more because the lower resistor string 46 needs not to be specially provided.

According to the fourth embodiment of the present invention, since the lower select switches are replaced with the low withstand voltage transistors each having the small area, respectively, the area occupied by the D/A converter can be reduced without exerting any of influences on the performance.

In addition, the on-resistance of the switch is small because the low withstand voltage transistor has the small parasitic capacitance parasitized thereon, and has a thin gate oxide film. Thus, the switch is obtained which has a small parasitic capacitance parasitized thereon, and has a low resistance. As a result, there is offered an advantage that the conversion speed is not so much reduced as is enhanced.

It should be understood by those skilled in the art that various modifications, combinations, sub-combinations and alterations may occur depending on design requirements and other factors insofar as they are within the scope of the appended claims or the equivalents thereof.

What is claimed is:

1. A digital-to-analog converter, comprising:
   a higher resistor string configured to generate a plurality of higher voltage values corresponding to higher-order bits of an input digital signal, respectively;

a lower resistor string configured to generate a plurality of lower voltage values corresponding to lower-order bits of the input digital signal, respectively;

an operational amplifier;

a higher selector configured to select one higher voltage value corresponding to the higher-order bits from among said plurality of higher voltage values generated in said higher resistor string, and output the one higher voltage value thus selected to one input of said operational amplifier;

a lower selector configured to select one lower voltage value corresponding to the lower-order bits from among said plurality of lower voltage values generated in said lower resistor string, and output the one lower voltage value thus selected to the other input of said operational amplifier;

a first switch connected to an output of said higher selector;

a higher capacitor connected between said first switch and the one input of said operational amplifier;

a second switch connected between one electrode of said higher capacitor and an output of said operational amplifier;

a third switch connected between the other electrode of said higher capacitor and the output of said operational amplifier; and a control circuit configured to control said first, second and third switches.

2. The digital-to-analog converter according to claim 1, wherein a lower capacitor is connected between said lower selector and the other input of said operational amplifier; and a fourth switch which is turned on when an initial D.C. voltage is set in the other input of said operational amplifier is connected to a connection node between said lower capacitor and said operational amplifier.

3. The digital-to-analog converter according to claim 2, wherein capacitance values of said higher capacitor and said lower capacitor are set so that capacitance values when viewed from the connection nodes between the corresponding capacitors and said operational amplifier become equal to each other.

4. The digital-to-analog converter according to claim 1, wherein said higher resistor string includes a series connection body of a plurality of higher resistor elements having both ends to which a maximum voltage and a minimum voltage are applied, respectively;

said lower resistor string includes a series connection body of a plurality of lower resistor elements having both ends across which a voltage equivalent to a section voltage generated across the both ends of each of said higher resistor elements is applied;

said higher selector has a plurality of higher select switches which are connected to all connection nodes between the adjacent higher resistor elements in said higher selector, and a node having the maximum voltage or minimum voltage supplied, respectively;

said lower selector has a plurality of lower select switches which are connected to all connection nodes between the adjacent lower resistor elements in said lower selector, and a node having the voltage, equivalent to the section voltage, supplied, respectively;

each of said plurality of select switches has a withstand voltage adapted to treat the maximum voltage; and each of said plurality of lower select switches has a withstand voltage which is lower than that of each of said plurality of higher select switches within a range of being adapted to treat a maximum potential of the section voltage value.

5. The digital-to-analog converter according to claim 1, wherein said higher resistor string includes a series connection body of a plurality of higher resistor elements having both ends to which a maximum voltage and a minimum voltage are applied, respectively;

said lower resistor string includes a series connection body of a plurality of lower resistor elements having both ends across which a voltage equivalent to a section voltage generated across the both ends of each of said higher resistor elements is applied; and said lower resistor string is inserted between the arbitrary two higher resistor elements of said plurality of higher resistor elements, and said higher resistor string and said lower resistor string form one series connection body.

6. The digital-to-analog converter according to claim 5, wherein an insertion position of said lower resistor string is located between the higher resistor element at one of the both ends of said higher resistor string, and the higher resistor element next to the higher resistor element.

7. The digital-to-analog converter according to claim 5, wherein said higher selector has a plurality of higher select switches which are connected to all connection nodes between the adjacent higher resistor elements in said higher selector, and a node having the maximum voltage or minimum voltage supplied, respectively;

said lower selector has a plurality of lower select switches which are connected to all connection nodes between the adjacent lower resistor elements in said lower selector, and a node having the voltage, equivalent to the section voltage, supplied, respectively;

each of said plurality of select switches has a withstand voltage adapted to treat the maximum voltage; and each of said plurality of lower select switches has a withstand voltage which is lower than that of each of said plurality of higher select switches within a range of being adapted to treat a maximum potential of the section voltage value in the insertion position of said lower resistor string to said higher resistor string.

8. The digital-to-analog converter according to claim 1, wherein a sample and hold adder including said operational amplifier, and said first, second and third switches, said higher selector and said lower selector are provided in each of the plurality of units to which a digital signal having predetermined bits is inputted in order; and said higher resistor string and said lower resistor string are commonly provided in each of said plurality of units.

9. An image display device, comprising:

a pixel portion having a large number of voltage driven pixels arranged in matrix;

a plurality of signal lines provided so as to correspond to columns of the pixels in said pixel portion;

a plurality of driving units provided so as to correspond to said plurality of signal lines, respectively;

a higher resistor string provided in each of said plurality of driving units configured to generate a plurality of higher voltage values corresponding to higher-order bits of an input digital video signal, respectively;

a lower resistor string provided in each of said plurality of driving units configured to generate a plurality of lower voltage values corresponding to lower-order bits of the input digital video signal, respectively;

each of said plurality of driving units, including
- an operational amplifier,
- a higher selector configured to select one higher voltage value corresponding to the higher-order bits from among said plurality of higher voltage values generated in said higher resistor string, and output the one higher voltage value thus selected to one input of said operational amplifier,
- a lower selector configured to select one lower voltage value corresponding to the lower-order bits from among said plurality of lower voltage values generated in said lower resistor string, and output the one lower voltage value thus selected to the other input of said operational amplifier,
- a first switch connected to an input of said higher selector,
- a higher capacitor connected between said first switch and the one input of said operational amplifier,
- a second switch connected between one electrode of said higher capacitor and an output of said operational amplifier,
- a third switch connected between the other electrode of said higher capacitor and the output of said operational amplifier, and said image display device further including
- a control circuit configured to control said first, second and third switches.

10. The image display device according to claim 9, wherein a lower capacitor is connected between said lower selector and the other input of said operational amplifier in each of said plurality of driving units; and
- a fourth switch which is turned on, when an initial D.C. voltage is set in the other input of said operational amplifier, in accordance with the control made by said control circuit is connected to a connection node between said lower capacitor and said operational amplifier in each of said plurality of driving units.

11. The image display device according to claim 10, wherein capacitance values of said higher capacitor and said lower capacitor are set so that capacitance values when viewed from the connection nodes between the corresponding capacitors and said operational amplifier become equal to each other.

* * * * *